United States Patent [19]
Trick

[11] Patent Number: 5,995,405
[45] Date of Patent: Nov. 30, 1999

[54] MEMORY MODULE WITH FLEXIBLE SERIAL PRESENCE DETECT CONFIGURATION

[75] Inventor: Steven G. Trick, Meridian, Id.

[73] Assignee: Micron Technology, Inc., Boise, Id.

[21] Appl. No.: 09/179,634

[22] Filed: Oct. 27, 1998

[51] Int. Cl.[6] .................................. G11C 5/06; G11C 8/00
[52] U.S. Cl. ......................... 365/63; 361/777; 710/104; 365/230.03
[58] Field of Search .............................. 613/777; 365/52, 365/230.03, 51, 63; 174/261; 710/100, 101, 102, 104

[56] References Cited

U.S. PATENT DOCUMENTS 5,625,603  4/1997  McClure et al. .................. 365/230.03

Primary Examiner—Leo P. Picard
Assistant Examiner—John B. Vigushin
Attorney, Agent, or Firm—Dickstein Shapiro Morin & Oshinsky LLP

[57] ABSTRACT

The invention comprises a in line memory module which includes connections on its surface so that either a standard Electrically Erasable Programmable Read Only Memory (EEPROM), or a "daisy chain" EEPROM can be utilized with the memory module.

59 Claims, 3 Drawing Sheets

FIG. 1 -PRIOR ART-
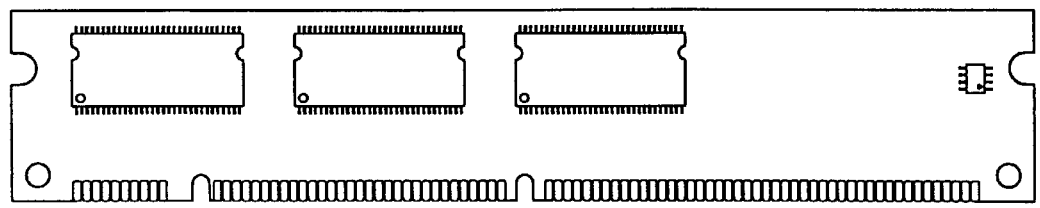
FIG. 2
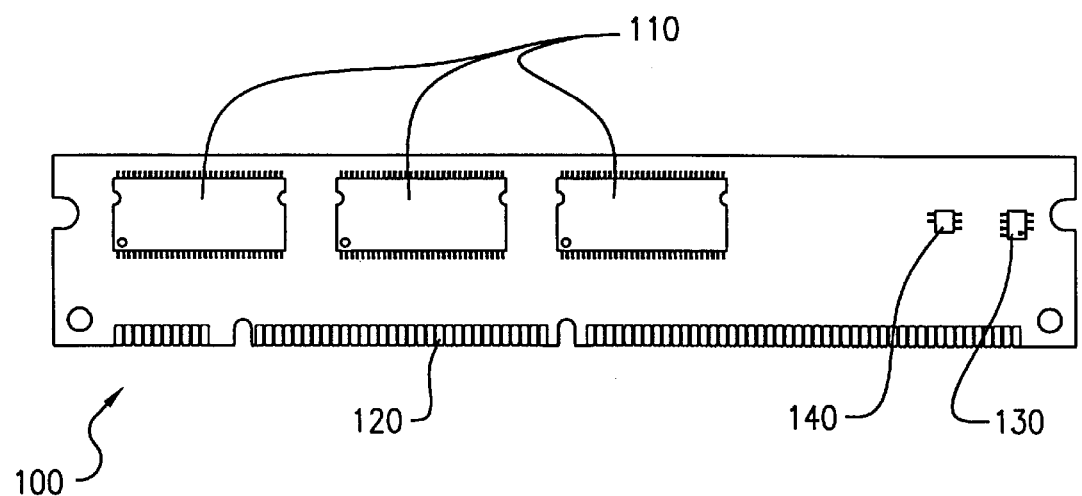

MEMORY MODULE WITH FLEXIBLE SERIAL PRESENCE DETECT CONFIGURATION

BACKGROUND OF THE INVENTION

1. Field of the Invention

The invention relates to a wiring configuration for memory module, for example, a Single (SIMM) or Dual In-Line Memory Module (DIMM).

2. Description of the Related Art

Memory Modules (e.g. Single In Line Memory Modules (SIMMs), Dual In Line Memory Modules (DIMMs), etc.) are an essential part of almost every computer. In fact, the random access memory (RAM) of most computers is comprised mainly of memory modules. Computer mother boards often include expansion ports for the placement of additional memory modules to increase the memory capacity of the computer. The memory module is essentially a circuit board with memory devices affixed to one or both sides thereof. These memory devices are typically DRAMs, but may also comprise other similar memories (e.g., SDRAMs, SRAMS, etc.) The circuit board also include terminals, or "pins" which facilitate communications between the memory devices and the rest of the computer (e.g., CPU, etc.). In Line Memory Modules (IMMs) are the most popular memory modules for use in computer systems. They include SIMMs and DIMMs. For convenience the ensuing discussion describes IMMs as representative of memory modules with which the invention may be used.

Most IMMs on the market today include an Electrically Erasable Programmable Read Only Memory (EEPROM) containng configuration information relating to the IMM. One of the main functions the EEPROM performs is serial presence detect (SPD) commonly used in computer systems. SPD is a method by which a IMM identifies itself to a (CPU of a computer through information stored in the EEPROM. The SPD is performed by a SPD processor in conjunction with the EEPROMs of the IMMs. When the computer first boots up, the SPD controller reads out the EEPROM of each memory module in order to identity to the CPU how much and what type of memory is installed.

FIG. 1 shows an exemplary IMM with an associated EEPROM attached thereto. The EEPROM typically includes 256 bytes of storage capacity. The first 128 bytes are used to store industry standard information relating to the IMM. The contents of each of these 128 bytes is specified by the Joint Electron Device Engineering Council (JEDEC). The other 128 bytes are usually reserved for use by either the manufacturer or purchaser of the IMM. Using a conventional JEDEC protocol, the EEPROMs of only eight IMMs can be addressed by the SPD controller because of the limited number of address pins (3) on the EEPROM and the computer bus structure. This causes a problem because it limits the amount of memory that can be utilized by the computer.

Recently, a new type of memory module architecture has been developed which allows more than eight memory modules and their associated EEPROMs to be addressed by a CPU. This new module is referred to as a "daisy chain" module because it has the capability to link together with other memory modules to increase memory capacity of a computer. The "daisy chain" memory module contains an EEPROM which is different from the EEPROM of the JEDEC specification and includes pins not present on traditional EEPROMs, which provide ports for the clock signals of several EEPROMs to be serially interconnected. By linking together the multiple EEPROMs of the multiple memory modules, the number of memory modules which can be addressed becomes unlimited. This new memory architecture is beginning to gain popularity and is being deployed in IMMs.

Since most IMMs were developed with configurations for the JEDEC standard only at present a memory module manufacturer must stock different circuit boards for JEDEC type of memory module and associated EEPROM as well as for a "daisy chain" type of memory module and its associated EEPROM. There is accordingly a current need for an IMM mounting board which can support either the JEDEC standard EEPROM or the newer "daisy chain" EEPROM, yet be universally accepted by computer systems designed for use with either architecture. There is also currently a need for a method for transforming exisitng circuit boards so that they can be used with either the JEDEC standard or the "daisy chain" EEPROM.

SUMMARY OF THE INVENTION

The present invention relates to wiring placed on the surface of a memory module, such as an IMM mounting board, for accommodating either standard EEPROM or a "daisy chain" EEPROM, while providing the proper pin-out terminals for a computer system no matter which of the two types of memory modules the system is designed for. Accordingly, the same mounting board can be used for providing the standard JEDEC memory module or a "daisy chain" type of memory module.

The above and other advantages and features of the present invention will be better understood from the following, detailed description of the preferred embodiments of the invention which is provided in connection with the accompanying drawings.

BRIEF DESCRIPTION OF THE DRAWINGS

FIG. 1 illustrates a representative prior art memory module;

FIG. 2 illustrates a representative memory module employing the present invention; and, FIG. 3 illustrates the relevant wiring of a portion of the circuit board of the memory module employing the present invention in detail.

DETAILED DESCRIPTION OF THE PREFERRED EMBODIMENTS

Figure 3:
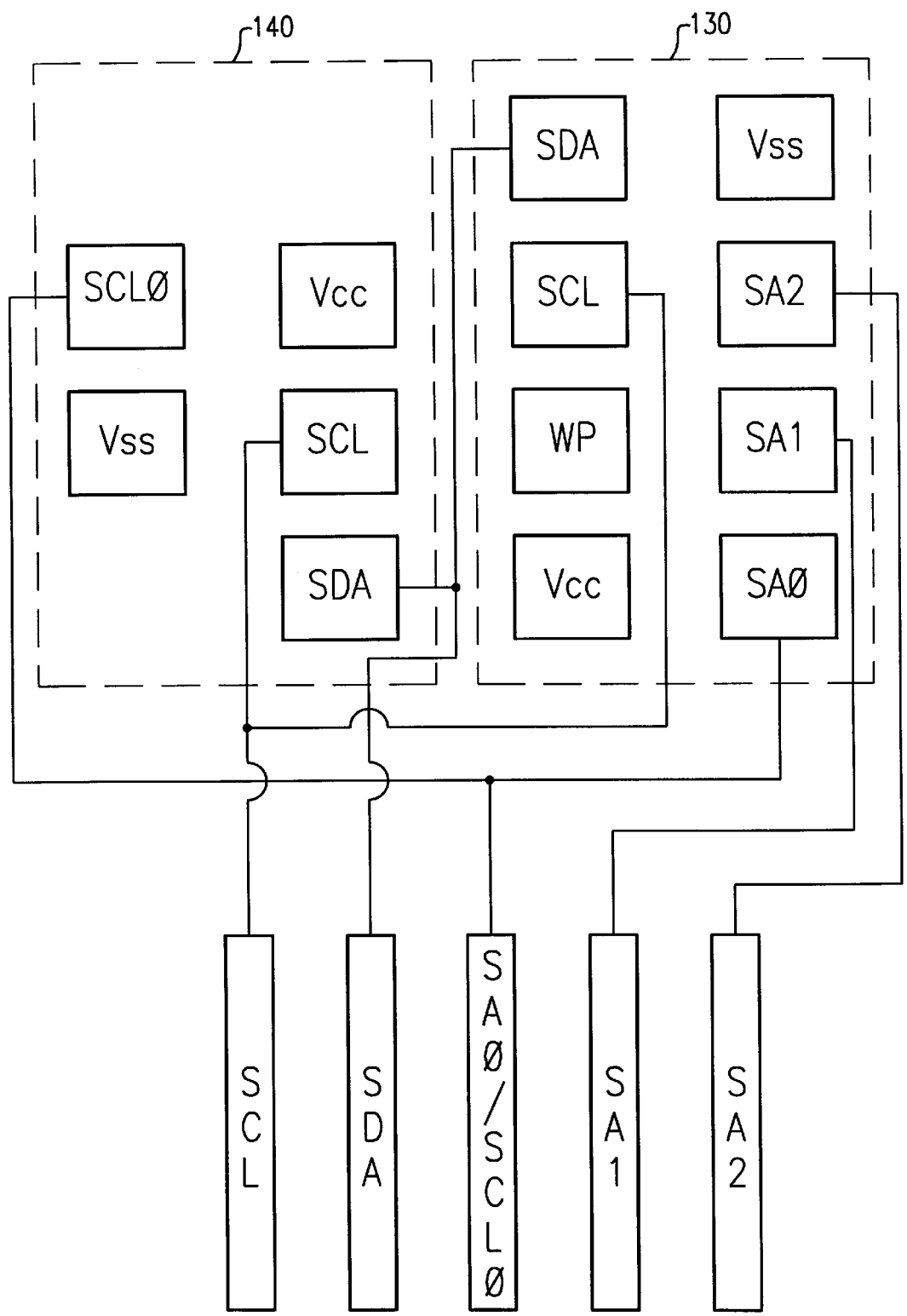

FIG. 2 shows a memory module 100 of the present invention. The memory module is shown as an IMM for purposes of further explanation. The IMM includes multiple memory chips (e.g. DRAMs) 110, and multiple edge connection pins 120 for mating with a memory socket of a computer system. The memory chip interconnect wiring pattern is omitted from FIG. 2 for sake of clarity. The IMM 100 also includes two land patterns 130, 140 for mounting of EEPROM chips. One land pattern 130 is for the placement of a JEDEC standard EEPROM chip, and the other land pattern 140 is for the placement of the "daisy chain" EEPROM chip. Therefore, by utilizing the present IMM 100, either a JEDEC standard EEPROM or a "daisy chain" EEPROM can be attached to the IMM circuit board, as will be explained in detail below.

Five connection pins on the right end of the FIG. 2 IMM enable the SPD processor to access the EEPROM, whether it be of the JEDEC standard or the "daisy chain" variety. FIG. 3 shows the IMM circuit board of FIG. 2 enlarged to show the circuit board electrical connections which connect the EEPROM terminals to the electrical contacts of the five edge connection pins of the IMM 100. The first pin (from left to right), SCL, is an input pin which provides a clock signal to the SCL terminals of both types of EEPROMs. The second pin, SDA, is an input/output pin which provides for data transfer to and from both types of EEPROMs. The last three pins, SA0–SA2, are used for addressing of the EEPROMs of the JEDEC standard IMM. These pins are input address pins which specify which IMM EEPROM is being addressed by the SPD processor. The SA0–SA2 pins are only used with the JEDEC standard EEPROM. Because of the limited number of address pins, the maximum number of IMM EEPROMs that can be addressed is eight (8).

For "daisy chain" memory modules the EEPROMs of the IMMs are addressed in sequence using an output clock from an upstream EEPROM to provide an input clock for the next in sequence EEPROM. A first clock signal from the SPD processor is sent to the SCL terminal of the EEPROM of a first memory module in a daisy chain. After that EEPROM data is read out over a data line SDA common to all memory modules and then the first addressed EEPROM sends a clock signal on line SCLO to the SCL input terminal of the EEPROM of the next memory module in the chain causing it to read out data to the SPD processor on line SDA. This sequence is repeated until all EEPROMs of all memory modules are read.

Thus, for a JEDEC type memory module terminals SCL, SDA, SAO, SA1 and SA2 are required to address the memory module EEPROM, while for a "daisy chain" type memory module terminals SCL, SDA and SCLO are required. FIG. 3 illustrates how both sets of terminals are integrated on a single circuit board using one wiring pattern for the JEDEC standard EEPROM and one wiring pattern for the "daisy chain" EEPROM.

The SA0/SCLO, SCL and SDA pins of the circuit board are the only pills shared between the JEDEC standard and the "daisy chain" EEPROMs. As explained above, the "daisy chain" EEPROM does not require address pins SA0–SA2, it does, however, require a SCLO pin. The SCL0 pin is used to supply a clock signal to the SCL input of the next "daisy chain" EEPROM in the chain. Therefore, when the JEDEC EEPROM is placed on land pattern 130, the circuit board pin SA0 is used for address control, but when the "daisy chain" EEPROM is placed on land pattern 140, the SA0 pin is used for the SCLO output clock signal.

The "daisy chain" EEPROM land pattern 140, includes terminals SCLO, Vss, Vcc, SCL and SDA. As explained above, the terminals SCL and SDA are for receiving a clock signal and for transferring data, respectively. The Vss terminal provides a ground connection for the EEPROM, and Vcc provides c power supply voltage for the EEPROM. The SCL0 terminal is the key element of the "daisy chain" EEPROM. The SCL0 terminal provides a clock output signal which is applied to the SCL input of the next in sequence "daisy chain" EEPROM.

The conventional JEDEC standard EEPROM includes terminals SCL, SDA, SA0, SA1, SA2, Vss, Vcc, and WP. The JEDEC, standard EEPROM shares common terminals SCL, SDA, Vss, and Vcc with the "daisy chain" EEPROM and therefore further discussion of these terminals will be omitted. The JEDEC standard EEPROM further includes address input terminals SA0–SA2. These terminals receive signals from the SPD processor (not shown) which specifies which one of the eight IMMs is being addressed at that time. The JEDEC standard EEPROM also includes a write protect terminal (WP), which is used to prevent overwriting of the information stored in the EEPROM.

The normal and the "daisy chain" EEPROM share terminals SDA and SCL in common, and therefore the SDA and SCL pins of the IMM are connected to the respective SCL and SDA terminals of both EEPROM land patterns 130, 140 (See FIG. 3). The SA1–SA2 pins of the IMM are only connected to the SA1–SA2 terminals of the normal EEPROM land pattern 130. The SA0/SCL0 shared pin of the IMM is connected to the SCL0 terminal of the "daisy chain" EEPROM land pattern 140, and the SA0 terminal of the normal EEPROM land pattern 130. Thus, if a JEDEC standard EEPROM is placed on land pattern 130, the wiring configuration allows the EEPROM to work properly with the memory module 100. Similarly, if a "daisy chain" EEPROM is placed on land pattern 140, the present wiring configuration allows the EEPROM to work properly with the memory module 100.

Figure 4:
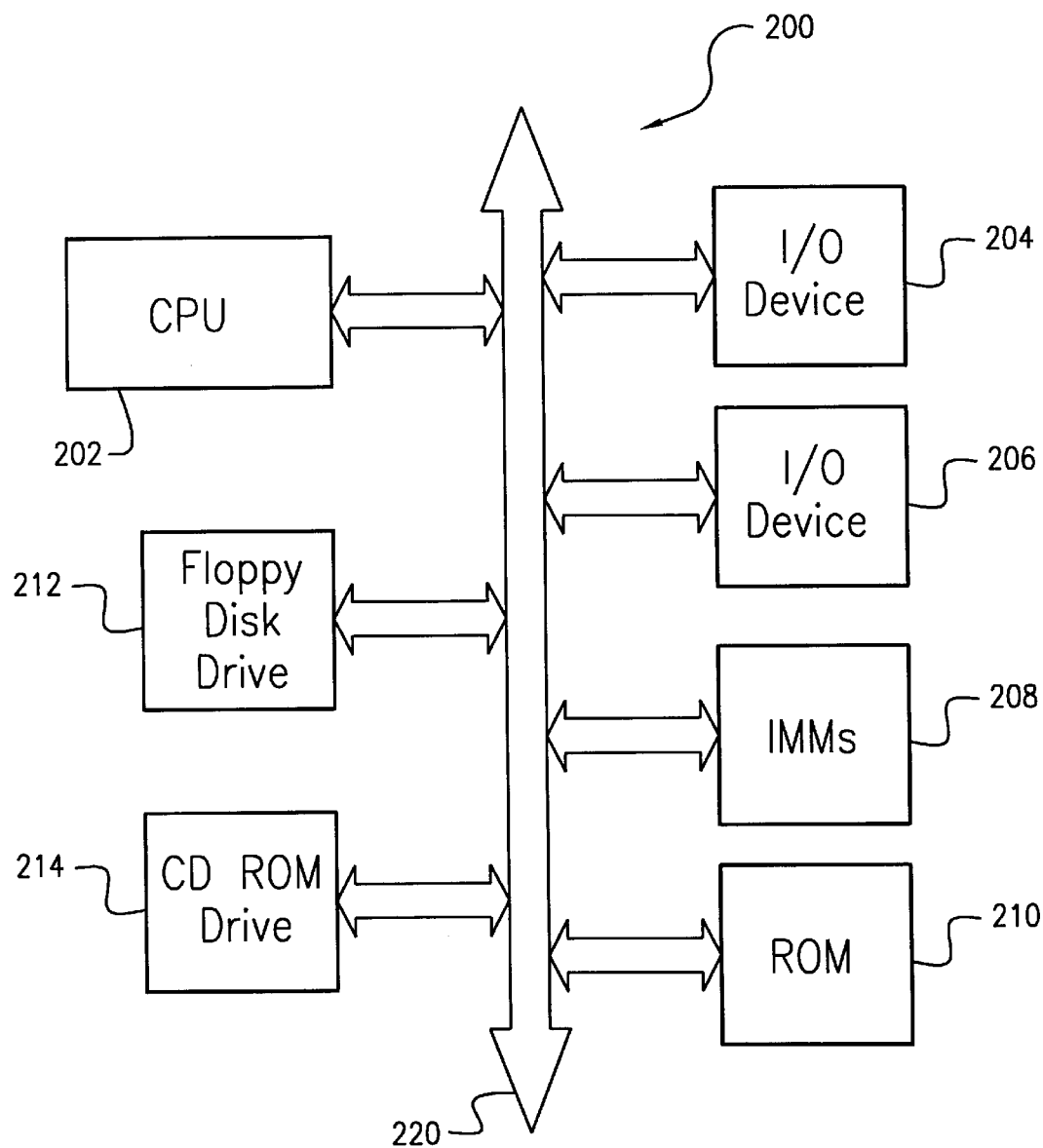
FIG. 4 illustrates a computer system utilizing the memory module constructed in accordance with the present invention.

FIG. 4 illustrates a processor-based system 200 including memory modules, here IMMs 208 constructed in accordance with the present invention. The processor-based system 200 may be a computer system, a process control system or any other system employing a processor and associated memory. The processor-based system includes a central processing unit (CPU) 202, e.g., a microprocessor, that communicates with the IMM and I/O devices 204, 206 over a bus 220. The processor-based system 200 also includes read only memory (ROM) 210, and may include peripheral devices such as a floppy disk drive 212 and a compact disk (CD) drive 214 that also communicate with the CPU 202 over the bus 220 as is well known in the art. An SPD processor (not shown) is connected between the IMMs 208 and the bus 220 to facilitate information transfer. In other words, when the processor-based system is first activated (i.e. switched on), the SPD processor works in conjunction with the EEPROMs of the IMMs to determine what type and kind of memory is attached to the system and to relay that information to the CPU 202 via bus 220.

It should be noted that although the invention has been described in terms of fabricating an entirely new circuit board which can connect to either JEDEC standard or "daisy chain" EEPROMs, the present invention also encompasses a method by which existing circuit boards, with JEDEC standard terminals, can be altered to accommodate both types of EEPROMs, by forming an additional wiring pattern on the existing circuit board for the "daisy chain" EEPROM. The additional wiring pattern would be fabricated to connect to the JEDEC standard EEPROM in the same way as described above with reference to FIG. 3.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A circuit board for a memory module comprising:

a circuit board substrate for mounting memory devices;

a plurality of input and output terminals provided on said substrate;

a first wiring pattern supported by said substrate and interconnecting at least a first portion of said input and output terminals with first connection points on said substrate for a first read only memory device; and a second wiring pattern supported by said substrate and interconnecting at least a second portion of said input and output terminals with second connection points on said substrate for a second read only memory device, at least one of the input and output terminals of said first and second portions being commonly connected to said first and second wiring patterns, said at least one commonly connected terminal being selected from the group consisting of a terminal which provides an address signal terminal for said first read only memory device and a clock signal terminal for said second read only memory device, and a terminal which provides a clock signal input terminal for said first and second read only memory devices.

2. The circuit board of claim 1, wherein said substrate is configured to provide a plug-in memory module.

3. The circuit board of claim 2, wherein said substrate is configured to provide an in line memory module.

4. The circuit board of claim 3, wherein said in line memory module is a SIMM.

5. The circuit board of claim 3, wherein said in line memory module is a DIMM.

6. The circuit board of claim 2, wherein said circuit board further comprises edge connectors defining said plurality of input and output terminals.

7. The circuit board of claim 1, wherein said at least one commonly connected terminal comprises a terminal which provides an address signal terminal for said first read only memory device and a clock signal terminal for said second read only memory device.

8. The circuit board of claim 1, wherein said at least first portion of input and output terminals include a clock signal terminal, a data signal terminal, a first address signal terminal, a second address signal terminal, and a third address signal terminal.

9. The circuit board of claim 8, wherein said at least second portion of input and output terminals include a first clock signal terminal, and a data signal terminal.

10. The circuit board of claim 1, wherein said first and second connection points are respectively provided by first and second read only memory device sockets mounted on said substrate.

11. The circuit board of claim 1, wherein said at least one commonly connected terminal further comprises a terminal which provides a data output terminal for said first and second read only memory devices.

12. The circuit board of claim 1, wherein said at least one commonly connected terminal comprises a terminal which provides a clock signal input terminal for said first and second read only memory devices.

13. The circuit board of claim 1, wherein said at least one commonly connected terminal comprises:

a first terminal which provides an address signal terminal for said first read only memory device and a clock signal output terminal for said second read only memory device;

a second terminal which provides a data output terminal for said first and second read only memory devices; and a third terminal which provides a clock signal input terminal for said first and second read only memory devices.

14. The circuit board of claim 13, wherein said plurality of input and output terminals include two terminals which provide additional address terminals for said first read only memory device.

15. A memory module comprising a circuit board comprising:

a substrate for mounting memory devices;

a plurality of input and output terminals provided on said substrate;

first wiring pattern supported by said substrate and interconnecting at least a first portion of said input and output terminals with first connection points on said substrate for a first read only memory device;

a second wiring pattern supported by said substrate and interconnecting at least a second portion of said input and output terminals with second connection points on said substrate for a second read only memory device, at least one of the input and output terminals of said first and second portions being commonly connected to said first and second wiring patterns, said at least one commonly connected terminal being selected from the group consisting of a terminal which provides an address signal terminal for said first read only memory device and a clock signal terminal tor said second read only memory device, and a terminal which provides a clock signal input terminal for said first and second read only memory devices; and a first or second read only memory device connected to a respective one of said first and second connection points.

16. The memory module of claim 15, further comprising at least one random access memory device connected to said substrate.

17. The memory module of claim 15, wherein said substrate is configured to provide a plug-in memory module.

18. The memory module of claim 17, wherein said substrate is configured to provide an in line memory module.

19. The memory module of claim 18, wherein said in line memory module is a SIMM.

20. The memory module of claim 18, wherein said in line memory module is a DIMM.

21. The memory module of claim 17, wherein said circuit board further comprises edge connectors defining said plurality of input and output terminals.

22. The memory module of claim 15, wherein said at least one commonly connected terminal comprises a terminal which provides an address signal terminal for said first read only memory device and a clock signal terminal for said second read only memory device.

23. The memory module of claim 15, wherein said at least first portion of input and output terminals include a clock signal terminal, a data signal terminal, a first address signal terminal, a second address signal terminal, and a third address signal terminal.

24. The memory module of claim 15, wherein said at least second portion of input and output terminals include a first clock signal terminal, and a data signal terminal.

25. The memory module of claim 15, wherein said first and second connection points are respectively provided by first and second read only memory device sockets mounted on said substrate.

26. The memory module of claim 15, wherein said at least one commonly connected terminal further comprises a terminal which provides a data output terminal for said first and second read only memory devices.

27. The memory module of claim 15, wherein said at least one commonly connected terminal comprises a terminal which provides a clock signal input terminal for said first and second read only memory devices.

28. The memory module of claim 15, wherein said at least one commonly connected terminal comprises:
- a first terminal which provides an address signal terminal for said first read only memory device and a clock signal output terminal for said second read only memory device;
- a second terminal which provides a data output terminal for said first and second read only memory devices; and
- a third terminal which provides a clock signal input terminal for said first and second read only memory devices.

29. The memory module of claim 28, wherein said plurality of input and output terminals include two terminals which provide additional address terminals for said first read only memory device.

30. A method of fabricating a memory module comprising the steps of:
- fabricating a plurality of input and output terminals on a circuit board substrate;
- fabricating a first wiring pattern on the substrate for connecting a first portion of said input and output terminals with first connection points on the substrate for a first read only memory device; and
- fabricating a second wiring pattern on the substrate for connecting a second portion of said input and output terminals with second connection points on the substrate for a second read only memory device,
- wherein at least one of the input and output terminals of said first and second portions is commonly connected to said first and second wiring patterns, said at least one commonly connected terminal being selected from the group consisting of a terminal which provides an address signal terminal for said first read only memory device and a clock signal terminal for said second read only memory device, and a terminal which provides a clock signal input terminal for said first and second read only memory devices.

31. The method of claim 30, wherein said step of fabricating a plurality of input and output terminals comprises forming edge connectors along the edge of the substrate.

32. The method of claim 30, wherein said at least one commonly connected terminal comprises a terminal which provides an address signal terminal for said first read only memory device and a clock signal terminal for said second read only memory device.

33. The method of claim 30, wherein said at least first portion of input and output terminals include a clock signal terminal, a data signal terminal, a first address signal terminal, a second address signal terminal, and a third address signal terminal.

34. The method of claim 30, wherein said at least second portion of input and output terminals include a first clock signal terminal, and at data signal terminal.

35. The method of claim 30, comprising the further step of:
- forming first and second read only memory device sockets on the substrate to connect to said first and second connection points.

36. The method of claim 30, wherein said at least one commonly connected terminal further comprises a terminal which provides a data output terminal for said first and second read only memory devices.

37. The method of claim 30, wherein said at least one commonly connected terminal comprises a terminal which provides a clock signal input terminal for said first and second read only memory devices.

38. The method of claim 30, wherein said at least one commonly connected terminal comprises:
- a first terminal which provides an address signal terminal for said first read only memory device and a clock signal output terminal for said second read only memory device;
- a second terminal which provides a data output terminal for said first and second read only memory devices; and
- a third terminal which provides a clock signal input terminal for said first and second read only memory devices.

39. A memory module comprising:
- a circuit board substrate;
- a plurality of input and output terminals provided on said substrate;
- a first wiring pattern for connecting first connection points for a first EEPROM to a first portion of said input and output terminals to provide a first clock input terminal, a clock output terminal, and a data output terminal for said first EEPROM;
- a second wiring pattern for connecting second connection points for a second EEPROM to a second portion of said input and output terminals to provide a first address terminal, a second address terminal, a third address terminal, a clock input terminal, and a data output terminal for said second EEPROM;
- said first and second wiring patterns interconnecting the clock output terminal the first address terminal.

40. A memory module comprising:
- a circuit board substrate;
- a plurality of random access memory devices attached to the substrate;
- a plurality of input and output terminals provided on said substrate;
- a first wiring pattern for connecting first connection points for a first EEPROM to a first portion of said input and output terminals to provide a first clock input terminal, a clock output terminal, and a data output terminal for said first EEPROM;
- a second wiring pattern for connecting second connection points for a second EEPROM to a second portion of said input and output terminals to provide a first address terminal, a second address terminal, a third address terminal, a clock input terminal, and a data output terminal for said second EEPROM;
- said first and second wiring patterns interconnecting the clock output terminal and the first address terminal.

41. A processor-based system comprising:
- a processor; and
- at least one memory module connected to said processor, said memory module comprising a circuit board comprising:
- a substrate for mounting memory devices;
- a plurality of input and output terminals provided on said substrate;
- a first wiring pattern supported by said substrate and interconnecting at least a first portion of said input and output terminals with first connection points on said substrate for a first read only memory device;
- a second wiring pattern supported by said substrate and interconnecting at least a second portion of said input and output terminals with second connection points on said substrate for a second read only memory device, at least one of the input and output terminals of said first and second portions being commonly connected to said first and second wiring patterns, said at least one commonly connected terminal being selected from the group consisting of a terminal which provides an address signal terminal for said first read only memory device and a clock signal terminal for said second read only memory device, and a terminal which provides a clock signal input terminal for said first and second read only memory devices; and a first or second read only memory device connected to a respective one of said first and second connection points.

42. The memory system of claim 41, further comprising at least one random access memory device connected to said substrate.

43. The system of claim 41, wherein said substrate is configured to provide a plug-in memory module.

44. The system of claim 43, wherein said substrate is configured to provide an in line memory module.

45. The system of claim 44, wherein said in line memory module is a SIMM.

46. The system of claim 44, wherein said in line memory module is a DIMM.

47. The system of claim 43, wherein said circuit board further comprises edge connectors defining said plurality of input and output terminals.

48. The system of claim 41, wherein said at least one commonly connected terminal includes a terminal which provides an address signal terminal for said first read only memory device and a clock signal terminal for said second read only memory device.

49. The system of claim 41, wherein said at least first portion of input and output terminals include a clock signal terminal, a data signal terminal, a first address signal terminal, a second address signal terminal, and a third address signal terminal.

50. The system of claim 41, wherein said at least second portion of input and output terminals include a first clock signal terminal, and a data signal terminal.

51. The system of claim 41, wherein said first and second connection points are respectively provided by first and second read only memory device sockets mounted on said substrate.

52. The system of claim 41, wherein said at least one commonly connected terminal further includes a terminal which provides a data output terminal for said first and second read only memory devices.

53. The system of claim 41, wherein said at least one commonly connected terminal includes a terminal which provides a clock signal input terminal for said first and second read only memory devices.

54. The system of claim 41, wherein said at least one commonly connected terminal includes a first terminal which provides an address signal terminal for said first read only memory device and a clock signal output terminal for said second read only memory device;

a second terminal which provides a data output terminal for said first and second read only memory devices; and a third terminal which provides a clock signal input terminal for said first and second read only memory devices.

55. The system of claim 54, wherein said plurality of input and output terminals include two terminals which provide additional address terminals for said first read only memory device.

56. A method of altering a memory module circuit board substrate which already includes a set of terminals for a first read only memory device to enable the memory module to connect with either the first read only memory device or a second read only memory device mounted on said substrate comprising the steps of:

fabricating a wiring pattern on the substrate of the memory module which connects terminals of the first and second read only memory devices to edge connector pins along an edge of the substrate, said wiring pattern connecting the terminals and the edge connector pins so that said first and second read only memory devices share usage of one of at least one of the edge connector pins, said at least one shared connector pin being selected from the group consisting of a connector pin which provides an address signal terminal for said first read only memory device and a clock signal terminal for said second read only memory device, and a connector pin which provides a clock signal input terminal for said first and second read only memory devices.

57. A memory module comprising:

a first wiring pattern for connecting edge pins of the memory module to a first read only memory, said first wiring pattern comprising a first clock terminal, a second clock terminal, and a data terminal;

a second wiring pattern for connecting edge pins of the memory module to a second read only memory, said second wiring pattern comprising a first address terminal, a second address terminal, a third address terminal, a clock terminal, and a data terminal;

wherein said edge pins comprise a clock pin, a data pin, a first address pin, a second address pin, and a third address pin arranged along the periphery of the memory module;

wherein the first clock terminal of the first wiring pattern is connected to the first address pin by a first portion of the first wiring pattern, the data terminal of the first wiring pattern is connected to the data pin of the memory module by a second portion of the first wiring pattern, the second clock terminal of the first wiring pattern is connected to the clock pin of the memory module by a third portion of the first wiring pattern; and, wherein the first address terminal of the second wiring pattern is connected to the first address pin of the memory module by a first portion of the second wiring pattern, the second and third address terminals of the second wiring pattern are connected to the second and third address pins of the memory module by a second portion of the second wiring pattern, the clock terminal of the second wiring pattern is connected to the clock pin of the memory module by a third portion of the second wiring pattern, and the data terminal of the second wiring pattern is connected to the data pin of the memory module by a fourth portion of the second wiring pattern.

58. A memory module comprising:

a circuit board;

a plurality of input and output terminals provided on a substrate of said circuit board;

a first wiring pattern for connecting first connection points for a first ROM to a first portion of said input and output terminals to provide a first clock input terminal, a clock output terminal, and a data output terminal for said first ROM;

a second wiring pattern for connecting connection points for a second ROM to a second portion of said input and output terminals to provide a first address terminal, a second address terminal, a third address terminal, a clock input terminal and a data output terminal for said second ROM, said first and second wiring patterns interconnecting the clock output terminal and the first address terminal.

59. A memory module comprising:

a circuit board;

a plurality of random access memory devices attached to a substrate of said circuit board;

a plurality of input and output terminals provided on said substrate of said circuit board;

a first wiring pattern for connecting first connection points for a first ROM to a first portion of said input and output terminals to provide a first clock input terminal, a clock output terminal, and a data output terminal for said first ROM;

a second wiring pattern for connecting connection points for a second ROM to a second portion of said input and output terminals to provide a first address terminal, a second address terminal, a third address terminal, a clock input terminal and a data output terminal for said second ROM;

said first and second wiring patterns interconnecting the clock output terminal and the first address terminal.

\* \* \* \* \*

UNITED STATES PATENT AND TRADEMARK OFFICE
CERTIFICATE OF CORRECTION

PATENT NO. : 5,995,405

DATED : November 30, 1999

INVENTOR(S) : Steven G. Trick

It is certified that error appears in the above-identified patent and that said Letters Patent is hereby corrected as shown below:

Column 7, line 56, before "data", cancel "at", substitute --a--.

Signed and Sealed this

Eighteenth Day of July, 2000

Attest:

Q. TODD DICKINSON

*Attesting Officer*     *Director of Patents and Trademarks*